(12) United States Patent
Nasu et al.

(10) Patent No.: US 8,530,801 B2
(45) Date of Patent: Sep. 10, 2013

(54) METHOD AND APPARATUS FOR MANUFACTURING SEMICONDUCTOR WAFER

(75) Inventors: Yuichi Nasu, Kanagawa (JP); Hirotaka Katou, Kanagawa (JP); Kazuhiro Narahara, Kanagawa (JP); Hideyuki Matsunaga, Kanagawa (JP)

(73) Assignee: Sumco Techxiv Kabushiki Kaisha, Kanagawa (JP)

( * ) Notice: Subject to any disclaimer, the term of this patent is extended or adjusted under 35 U.S.C. 154(b) by 982 days.

(21) Appl. No.: 11/922,997

(22) PCT Filed: Jun. 30, 2006

(86) PCT No.: PCT/JP2006/313082
§ 371 (c)(1),
(2), (4) Date: Dec. 28, 2007

(87) PCT Pub. No.: WO2007/004550
PCT Pub. Date: Jan. 11, 2007

(65) Prior Publication Data
US 2009/0226293 A1      Sep. 10, 2009

(30) Foreign Application Priority Data
Jul. 6, 2005    (JP) .................................. 2005-197887

(51) Int. Cl.
*H05B 3/06* (2006.01)
(52) U.S. Cl.
USPC ........................................................ 219/536
(58) Field of Classification Search
USPC .................. 432/239, 241; 414/217
See application file for complete search history.

(56) References Cited

U.S. PATENT DOCUMENTS

| | | | |
|---|---|---|---|
| 6,331,212 B1 * | 12/2001 | Mezey, Sr. ..................... | 118/725 |
| 6,742,977 B1 * | 6/2004 | Okayama et al. ............. | 414/217 |
| 6,859,616 B2 * | 2/2005 | Kusuda et al. ................ | 392/416 |
| 7,033,445 B2 * | 4/2006 | Keeton et al. ................. | 118/725 |
| 2004/0112890 A1 * | 6/2004 | Kusuda et al. ................ | 219/520 |
| 2004/0129225 A1 * | 7/2004 | Kashino ......................... | 118/728 |
| 2005/0000449 A1 * | 1/2005 | Ishibashi et al. .............. | 118/728 |

FOREIGN PATENT DOCUMENTS

| | | |
|---|---|---|
| JP | 08-236462 | 9/1996 |
| JP | 2000-260851 | 9/2000 |
| JP | 2000-269137 | * 9/2000 |

OTHER PUBLICATIONS

International Search Report, Sep. 12, 2006.

* cited by examiner

*Primary Examiner* — Steven B McAllister
*Assistant Examiner* — John Bargero
(74) *Attorney, Agent, or Firm* — Husch Blackwell LLP

(57) ABSTRACT

A method and an apparatus for manufacturing a semiconductor wafer are provided for improving a quality of the semiconductor wafer, and further, for improving a quality of a semiconductor device manufactured by using the semiconductor wafer, by preventing warping from being generated at a stage of a placing step, at the time of performing heat treatment to a semiconductor wafer substrate. The placing process is performed by a placing means so that a time when a temperature difference between a wafer front surface temperature and a wafer rear surface temperature becomes maximum, and a time when warping is generated in the wafer are prior to a time when the wafer is brought into contact with lift pins or a susceptor (i.e., a time after the temperature is at an upper limit value of an infrared temperature region at 600° C.), and the lift pins are brought into contact with the wafer rear surface.

6 Claims, 9 Drawing Sheets

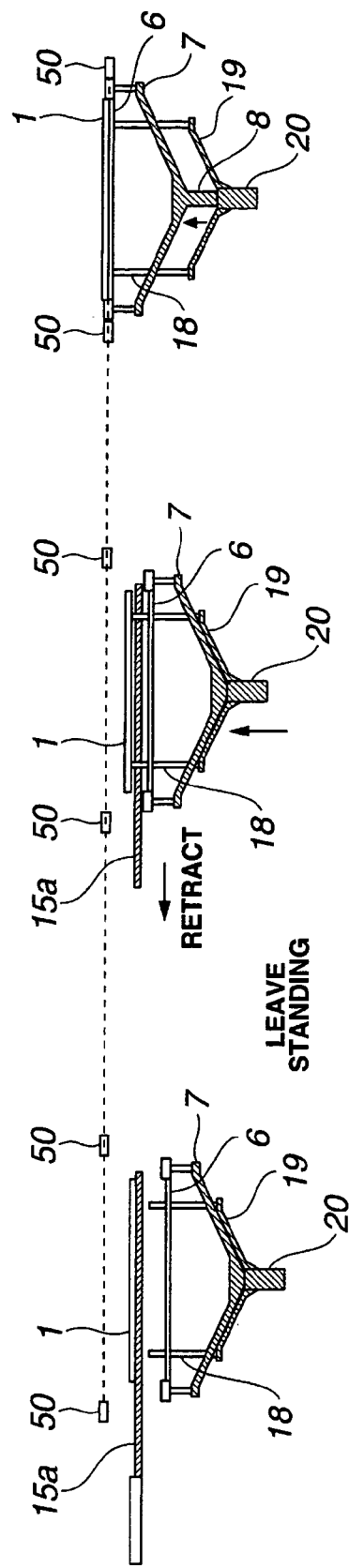

EXAMPLE
LEAVE STANDING FOR 20 SEC.
WARPS IN A CONCAVE SHAPE IN ABOUT 15 SEC.
CONVERGENCE OF VIBRATIONS
CONTACT WITH SUSCEPTOR
FIG.4A     FIG.4B     FIG.4C     FIG.4D
COMPARATIVE EXAMPLE
LEAVE STANDING FOR 10 SEC.
WAFER IS CONTACTED WITH PINS AND SUDDENLY WARPED INTO A CONCAVE SHAPE.
CONTACT WITH SUSCEPTOR
FIG.5A     FIG.5B     FIG.5C     FIG.5D

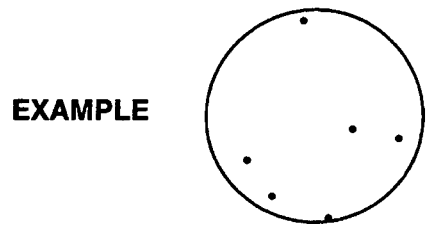
EXAMPLE
FIG.8A
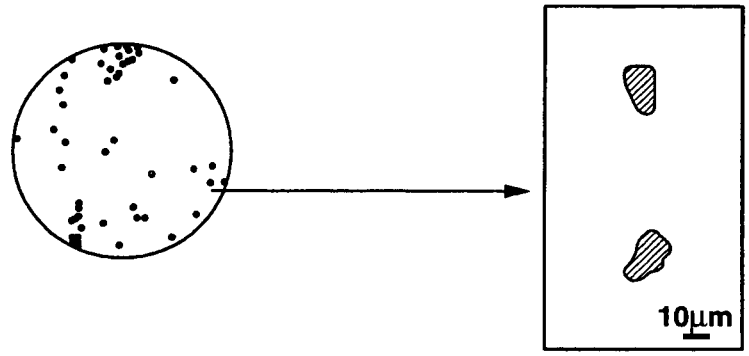
COMPARATIVE EXAMPLE
FIG.8B
COMPARATIVE EXAMPLE
FIG.8C

METHOD AND APPARATUS FOR MANUFACTURING SEMICONDUCTOR WAFER

This application claims priority of PCT/JP2006/313082 filed Jun. 30, 2006, which is based on Japanese Patent Application Number 2005-197887 filed on Jun. 7, 2005.

TECHNICAL FIELD

The present invention relates to a method and an apparatus for manufacturing a semiconductor wafer, and more particularly to a method and an apparatus for manufacturing a silicon epitaxial wafer by transferring a silicon single crystal substrate to an epitaxial growth furnace which is used as a heat treatment chamber.

BACKGROUND ART

The silicon epitaxial wafer is manufactured as follows.
(Transferring Step)
A silicon wafer substrate is placed on a blade (transfer table) of a transfer robot and transferred from a buffer chamber to the above of a susceptor (processing table) in an epitaxial growth furnace (heat treatment chamber). At the time of transferring, the interior of the epitaxial growth furnace is previously heated to a certain temperature (transferring temperature) by lamp heating.
(Placing Step)
The silicon wafer substrate on the blade is lifted by lift pins. The blade is externally retracted from the epitaxial growth furnace. The susceptor is moved up to place the silicon wafer substrate on the susceptor. Thus, the silicon wafer substrate is moved from the blade onto the susceptor.
(Heat Treatment Step)
Then, the silicon wafer substrate is heated by lamp heating up to a temperature (>1100° C.) suitable for vapor phase growth. And, material gas for forming an epitaxially-grown film is flown along the front surface of the silicon wafer substrate. Thus, a thin film of the same silicon epitaxial growth layer is formed on the front surface of the silicon wafer substrate.

With the advance of miniaturization and high resolution of the semiconductor device in these years, the crystal quality demanded for the epitaxial silicon wafer has become high, and a high yield is also demanded.

Originally, the crystal quality of the epitaxial growth layer is considerably higher than that of the silicon wafer substrate, and the epitaxial growth layer is considered to be a defect-free layer which is free from a grown-in defect.

But, the process (placing step) of placing the silicon wafer substrate on the susceptor by transferring into the epitaxial growth furnace has a problem that the silicon wafer substrate is warped.

Specifically, when the silicon wafer substrate is transferred from the buffer chamber having normal temperature into the epitaxial growth furnace which is previously heated to a transferring temperature, the silicon wafer substrate suffers from a sudden temperature change to form a sudden temperature gradient, causing an inconsistency of a thermal stress. If the inconsistency of the thermal stress exceeds a critical point, the individual portions of the silicon wafer substrate are warped to have a concave shape. The warping affects adversely on the quality of the silicon epitaxial wafer. Therefore, the following measures have been taken to avoid it.

(Conventional Technology Described in Patent Literature)
Patent Literature 1 points out a problem that if the silicon wafer substrate is warped while it is being lifted up by the lift pins, the wafer back surface is rubbed by the lift pins having a rough contact surface, and scratches or particles are generated on the wafer back surface. In order to prevent the warping from occurring, the heating lamps above the epitaxial growth furnace are turned off to keep the furnace interior in a low temperature state, the silicon wafer substrate is placed from the blade onto the susceptor, and the upper heating lamps are turned on to perform epitaxial growth. Patent Literature 1 processes the silicon wafer substrate having a diameter of 150 mm (paragraph (0033) of Patent Literature 1). It is also considered that the silicon wafer substrate has a low temperature of merely 400° C. at the time when the silicon wafer substrate is placed to the susceptor (paragraph (0027) of Patent Literature 1).
Patent Literature 1: JP-A 2000-269137

SUMMARY OF THE INVENTION

Problems to be Solved by the Invention

In recent years, the silicon wafer substrate has come to have a large diameter of up to 300 mm, and it has been found that warping of the silicon wafer substrate generated in a placing step causes defects with large size particles peculiar to the epitaxial growth layer, and such defects are considerably serious in view of the quality of the semiconductor device.

Specifically, in the experiments performed by the present inventors, the silicon wafer substrate was transferred to the above of a susceptor of an epitaxial growth furnace which is preheated to a temperature of 650° C. and left standing as it was for 10 seconds, then the above-described placing step was performed to place the silicon wafer substrate from the blade onto the susceptor. Then, the silicon wafer substrate was warped in the placing step. If the lift pins were contacted with the wafer back surface, the wafer was suddenly warped, and the wafer back surface was rubbed by the lift pins to generate dust from the wafer back surface. The generated dust moved to the front surface of the silicon wafer substrate. Then, when the epitaxial growth was performed, defects grew with foreign substances, which were present on the front surface of the silicon wafer substrate, as cores and appeared as defects with large size particles (as defects having a diameter of about 0.25 µm or more and about 10 µm) on the front surface of the silicon epitaxial wafer. These defects with large size particles were checked by measuring by a particle counter. The defects with large size particles are defects peculiar to the epitaxial growth layer similar to a stacking fault or a mound and must be removed in order to keep the quality of the semiconductor device at a high level.

The present invention has been made in view of the above circumstances and has an object to overcome the above problems by preventing the occurrence of warping of the semiconductor wafer substrate in the placing step when it is subjected to a heat treatment so as to highly improve the quality of the semiconductor wafer and also the quality of the semiconductor device manufactured from it.

The above-described Patent Literature 1 has pointed out the problem of scratches and particles on the wafer back surface but not pointed out the defects with large size particles on the front surface of the epitaxial growth layer as a problem.

In the above-described Patent Literature 1, the silicon wafer substrate has a temperature of merely 400° C. when the silicon wafer substrate is placed on the susceptor; and it is assumed from that temperature that the temperature when the silicon wafer substrate is transferred into the epitaxial growth furnace is set to a low temperature of 400° C. or less. Therefore, there is a problem that it takes a long time to raise to a temperature suitable for the vapor phase growth.

Means for Solving the Problems

A first invention relates to a method for manufacturing a semiconductor wafer, comprising transferring the semiconductor wafer to a heat treatment chamber, placing the semiconductor wafer onto a processing table and performing a heat treatment of the semiconductor wafer, wherein:

the semiconductor wafer transferred to the heat treatment chamber is left standing for a prescribed leaving time to put the semiconductor wafer in a warped state and is placed onto the processing table.

A second invention relates to a method for manufacturing a semiconductor wafer, comprising transferring the semiconductor wafer to a heat treatment chamber, placing the semiconductor wafer onto a processing table and performing a heat treatment of the semiconductor wafer, wherein:

the semiconductor wafer transferred to the heat treatment chamber is left standing for a prescribed leaving time to cause a temperature difference between a front surface temperature and a back surface temperature of the semiconductor wafer reach a maximum value and is placed onto the processing table.

A third invention relates to a method for manufacturing a semiconductor wafer, comprising transferring the semiconductor wafer to a heat treatment chamber, placing the semiconductor wafer onto a processing table and performing a heat treatment of the semiconductor wafer, wherein:

the semiconductor wafer transferred to the heat treatment chamber is left standing for a leaving time of 20 seconds or more and is placed onto the processing table.

A fourth invention relates to a method for manufacturing a semiconductor wafer, comprising transferring the semiconductor wafer to a heat treatment chamber, placing the semiconductor wafer onto a processing table, and performing a heat treatment of the semiconductor wafer by a front surface-side heating means and a back surface-side heating means which are disposed at a front surface side and a back surface side of the semiconductor wafer, wherein:

at least one of three factors, which include a leaving time period between the transfer of the semiconductor wafer to the heat treatment chamber and the placing of the semiconductor wafer onto the processing table, a transferring temperature in the heat treatment chamber at the time when the semiconductor wafer is transferred to the heat treatment chamber and an output ratio between the front surface-side heating means and the back surface-side heating means, is controlled to put the semiconductor wafer in a warped state, and the semiconductor wafer is placed onto the processing table.

A fifth invention relates to a method for manufacturing a semiconductor wafer, comprising transferring the semiconductor wafer to a heat treatment chamber, placing the semiconductor wafer onto a processing table, and performing a heat treatment of the semiconductor wafer by a front surface-side heating means and a back surface-side heating means which are disposed at a front surface side and a back surface side of the semiconductor wafer, wherein:

at least one of three factors, which include a leaving time period between the transfer of the semiconductor wafer to the heat treatment chamber and the placing of the semiconductor wafer onto the processing table, a transferring temperature in the heat treatment chamber at the time when the semiconductor wafer is transferred to the heat treatment chamber and an output ratio between the front surface-side heating means and the back surface-side heating means, is controlled to cause a temperature difference between a front surface temperature and a back surface temperature of the semiconductor wafer reach a maximum value, and the semiconductor wafer is placed onto the processing table.

A sixth invention relates to an apparatus for manufacturing a semiconductor wafer, comprising:

a heat treatment chamber which is provided with a processing table on which the semiconductor wafer is placed, a transfer means which transfers the semiconductor wafer to the heat treatment chamber, a placing means which places the semiconductor wafer onto the processing table, a front surface-side heating means which heats a front surface of the semiconductor wafer, a back surface-side heating means which heats a back surface of the semiconductor wafer, and a control means which controls the transfer means and the placing means to leave standing the semiconductor wafer transferred to the heat treatment chamber for a prescribed leaving time period to put the semiconductor wafer in a warped state and to place the semiconductor wafer onto the processing table.

A seventh invention relates to an apparatus for manufacturing a semiconductor wafer, comprising:

a heat treatment chamber which is provided with a processing table on which the semiconductor wafer is placed, a transfer means which transfers the semiconductor wafer to the heat treatment chamber, a placing means which places the semiconductor wafer onto the processing table, a front surface-side heating means which heats a front surface of the semiconductor wafer, a back surface-side heating means which heats a back surface of the semiconductor wafer, and a control means which controls the transfer means and the placing means to leave standing the semiconductor wafer transferred to the heat treatment chamber for a prescribed leaving time period to cause a temperature difference between a front surface temperature and a back surface temperature of the semiconductor wafer reach a maximum value and to place the semiconductor wafer onto the processing table.

An eighth invention relates to an apparatus for manufacturing a semiconductor wafer, comprising:

a heat treatment chamber which is provided with a processing table on which the semiconductor wafer is placed, a transfer means which transfers the semiconductor wafer to the heat treatment chamber, a placing means which places the semiconductor wafer onto the processing table, a front surface-side heating means which heats a front surface of the semiconductor wafer, a back surface-side heating means which heats a back surface of the semiconductor wafer, and a control means which controls the transfer means and the placing means to leave standing the semiconductor wafer transferred to the heat treatment chamber for a leaving time period of 20 seconds or more and to place the semiconductor wafer onto the processing table.

A ninth invention relates to an apparatus for manufacturing a semiconductor wafer, comprising:

a heat treatment chamber which is provided with a processing table on which the semiconductor wafer is placed, a transfer means which transfers the semiconductor wafer to the heat treatment chamber, a placing means which places the semiconductor wafer onto the processing table, a front surface-side heating means which heats a front surface of the semiconductor wafer, a back surface-side heating means which heats a back surface of the semiconductor wafer, and a control means which controls at least one of three factors, which include a leaving time period between the transfer of the semiconductor wafer to the heat treatment chamber and the placing of the semiconductor wafer onto the processing table, a transferring temperature in the heat treatment chamber at the time when the semiconductor wafer is transferred to the heat treatment chamber, and an output ratio between the front surface-side heating means and the back surface-side heating means, to put the semiconductor wafer in a warped state and to place the semiconductor onto the processing table.

A tenth invention relates to an apparatus for manufacturing a semiconductor wafer, comprising:

a heat treatment chamber which is provided with a processing table on which the semiconductor wafer is placed, a transfer means which transfers the semiconductor wafer to the heat treatment chamber, a placing means which places the semiconductor wafer onto the processing table, a front surface-side heating means which heats a front surface of the semiconductor wafer, a back surface-side heating means which heats a back surface of the semiconductor wafer, and a control means which controls at least one of three factors, which include a leaving time period between the transfer of the semiconductor wafer to the heat treatment chamber and the placing of the semiconductor wafer onto the processing table, a transferring temperature in the heat treatment chamber at the time when the semiconductor wafer is transferred to the heat treatment chamber and an output ratio between the front surface-side heating means and the back surface-side heating means, to cause a temperature difference between a front surface temperature and a back surface temperature of the semiconductor wafer reach a maximum value and to place the semiconductor wafer onto the processing table.

An eleventh invention relates to the first invention to the fifth invention, wherein:

the semiconductor wafer is placed on the transfer table and transferred to the above of the processing table, and the processing to place the semiconductor wafer onto the processing table comprises a first processing to lift the semiconductor wafer, which is on the transfer table, by lift pins, a second processing to externally retract the transfer table from the heat treatment chamber and a third processing to move up the processing table or to move down the lift pins to place the semiconductor wafer on the processing table.

A twelfth invention relates to the sixth invention to the tenth invention, wherein:

the transfer means transfers the semiconductor wafer, which is on the transfer table, to the above of the processing table, and the placing process by the placing means comprises a first processing to lift the semiconductor wafer, which is on the transfer table, by lift pins, a second processing to externally retract the transfer table from the heat treatment chamber and a third processing to move up the processing table or to move down the lift pins to place the semiconductor wafer on the processing table.

The present invention is based on the premise that it involves a placing process (placing step) which is performed by a placing means 17 (such as lift pins 18) as exemplified below. The inventions corresponding to the exemplifications are the eleventh invention and the twelfth invention described above.

Specifically, as shown in FIGS. 3A, 3B, 3C, 3D, a silicon wafer substrate (semiconductor wafer) 1 which is placed on a blade 15a (transfer table) of a transfer robot 15 is transferred to the above of a susceptor 6 (processing table) (FIG. 3A). The silicon wafer substrate 1 which is placed on the blade 15a is left standing as it is for a prescribed leaving time (FIG. 3B). Then, the lift pins 18 are moved up, and the silicon wafer substrate 1 on the blade 15a is lifted by the lift pins 18. The blade 15a is externally retracted from a process chamber 4 (heat treatment chamber) (FIG. 3C). The susceptor 6 is moved up, and the silicon wafer substrate 1 is placed on the susceptor 6. Thus, the silicon wafer substrate 1 is placed from the blade 15a onto the susceptor 6 (the eleventh invention and the twelfth invention).

Findings of the present invention are as follows.

As shown in FIG. 7, when the silicon wafer substrate 1 is transferred to the process chamber 4, a front surface temperature and a back surface temperature of the silicon wafer substrate 1 having had normal temperature are increased in a substantially same curve. But, when they belong to an infrared temperature region at time t1, infrared transmittance becomes large, so that a difference between a wafer front surface temperature and a wafer back surface temperature increases gradually. This temperature difference has a maximum value at time t2 when the infrared temperature region has an upper limit value of 600° C. When the temperature difference becomes the maximum value, the silicon wafer substrate 1 performs heat diffusion. If the wafer back surface is contacted with the lift pins 18 before the temperature difference reaches the maximum value, the silicon wafer substrate 1 is warped suddenly and dust is produced.

Specifically, if the time when the temperature difference between the wafer front surface temperature and the wafer back surface temperature becomes the maximum value or the time when the silicon wafer substrate 1 is warped is a time when the wafer back surface is contacted with the lift pins 18 or the susceptor 6 or a time after the contact, the contact of the lift pins 18 or the susceptor 6 which is roughly finished with the wafer back surface causes to warp the silicon wafer substrate 1, and the warping (abrupt movement) causes to produce dust because the wafer back surface is rubbed by the lift pins 18 or the susceptor 6.

Accordingly, the present inventors considered that dust generation due to the warping of the wafer can be prevented if the temperature difference between the wafer front surface temperature and the wafer back surface temperature becomes a maximum value or the warping occurs before the contact with the lift pins 18 or the susceptor 6.

In other words, when the placing process is performed by the placing means 17 at a time later than the time t2 when the infrared temperature region has the upper limit value of 600° C. in FIG. 7 to contact the lift pins 18 with the wafer back surface, the dust generation due to the warping of the wafer can be prevented.

Factors for improvement of the dust generation due to the warping of the silicon wafer substrate 1 are combined into the following three, and an improving method is as follows.

Leaving Time

The leaving time means a time period between the transfer of the silicon wafer substrate 1 to the process chamber 4 and the transfer of the silicon wafer substrate 1 onto the susceptor 6. By setting the leaving time to a long time period, the placing process can be performed after waiting until the time t2 when the temperature difference between the wafer front surface temperature and the back surface temperature becomes the maximum value in FIG. 7.

Transferring Temperature

The transferring temperature means a temperature within the process chamber 4 at the time when the silicon wafer substrate 1 is transferred into the process chamber 4. Setting the transferring temperature to a high temperature allows advancing the time t2 when the temperature difference between the wafer front surface temperature and the back surface temperature of FIG. 7 reaches the maximum value, so that the transferring process can be performed after the time when the maximum value is obtained.

Output Ratio

The output ratio means an output ratio which is expressed by an electric power ratio (a power ratio) between wafer front surface-side heating lamps 5U and wafer back surface-side heating lamps 5L. By setting the output ratio to a level that the output of the wafer back surface-side heating lamps 5L is considerably larger than the output of the wafer front surface-side heating lamps 5U, heating of the wafer back surface can be rate-determined, and the time t2 when the temperature difference between the wafer front surface temperature and the back surface temperature becomes the maximum value can be advanced in FIG. 7, and the placing process can be performed at the time or after when the maximum value is obtained.

Accordingly, the method of the present invention controls at least one of the above three factors to generate warping in the silicon wafer substrate 1 and to place the silicon wafer substrate 1 onto the susceptor 6 (processing table) (the fourth invention).

Otherwise, it controls at least one of the three factors to cause the temperature difference between the front surface temperature and the back surface temperature of the silicon wafer substrate 1 reach the maximum value and to place the silicon wafer substrate 1 onto the susceptor 6 (processing table) (the fifth invention).

Among the three factors, the leaving time provides a particularly high improving effect.

Accordingly, the method of the first invention processes to leave standing the silicon wafer substrate 1, which is transferred to the process chamber 4 (heat treatment chamber), for a prescribed leaving time to generate warping in the silicon wafer substrate 1 and to place the silicon wafer substrate 1 onto the susceptor 6 (processing table).

The second invention processes to leave standing the silicon wafer substrate 1, which is transferred to the process chamber 4 (heat treatment chamber), for a prescribed leaving time to cause the temperature difference between the front surface temperature and the back surface temperature of the silicon wafer substrate 1 reach the maximum value and to place the silicon wafer substrate 1 onto the susceptor 6 (processing table).

When the leaving time is set to 20 seconds or more, the improving effect is particularly high. Specifically, as exemplified in FIG. 9, LPD counts are low considerably and the number of defects with large size particles measured on the wafer front surface is decreased considerably when the leaving time is set to 30 seconds than when it is set to 10 seconds.

Accordingly, the method of the third invention processes to leave standing the silicon wafer substrate 1, which is transferred to the process chamber 4 (heat treatment chamber), for a leaving time of 20 seconds or more and to place the silicon wafer substrate 1 onto the susceptor 6 (processing table).

The methods of the first invention through the fifth invention described above correspond to the sixth invention through the tenth invention which are apparatus inventions.

As shown in FIG. 1 and FIGS. 2A, 2B, the apparatus inventions of the sixth invention, the seventh invention and the eighth invention are comprised of the process chamber 4 (heat treatment chamber) in which the susceptor 6 (processing table) for placing the silicon wafer substrate 1 (semiconductor wafer) thereon is disposed, the transfer robot 15 (transfer means) for transferring the silicon wafer substrate 1 (semiconductor wafer) to the process chamber 4 (heat treatment chamber), the placing means 17 (such as the lift pins 18 and a drive source 21) for placing the silicon wafer substrate 1 (semiconductor wafer) on the susceptor 6 (processing table), the front surface-side heating lamps 5U (front surface-side heating means) for heating the front surface of the silicon wafer substrate 1 (semiconductor wafer), the back surface-side heating lamps 5L (back surface-side heating means) for heating the back surface of the silicon wafer substrate 1 (semiconductor wafer), and a controller 30 for controlling the leaving time by controlling the transfer robot 15 (transfer means) and the placing means 17.

The apparatus inventions of the ninth invention and the tenth invention are similarly provided with the process chamber 4 (heat treatment chamber), the transfer robot 15 (transfer means), the placing means 17 (such as the lift pins 18 and the drive source 21), the front surface-side heating lamps 5U (front surface-side heating means) and the back surface-side heating lamps 5L (back surface-side heating means), and also has the controller 30 for controlling at least one of the three factors (a leaving time, a transferring temperature and an output ratio).

Effects of the Invention

According to the present invention, the wafer is warped prior to the placing process when the semiconductor wafer substrate is undergone the heat treatment, so that the wafer is not warped (suddenly) in the placing process. Thus, the generation of dust due to warping of the wafer can be suppressed, and the quality of the semiconductor wafer and also the quality of the semiconductor device manufactured from it can be made high.

In comparison with the invention described in Patent Literature 1, the present invention increases the wafer temperature to at least 600° C. in the step of placing the wafer (FIG. 7), which is higher than the low temperature of only 400° C. of Patent Literature 1. Therefore, the present invention can increase to the temperature suitable for the vapor phase growth in a short time and excels in operating efficiency in comparison with the invention described in Patent Literature 1.

BEST MODE FOR CARRYING OUT THE INVENTION

Embodiments of the invention will be described with reference to the figures. It is assumed in the embodiments that the semiconductor epitaxial wafer is a silicon epitaxial wafer.

FIG. 1 shows a structure of a single wafer vapor-phase epitaxial growth apparatus of an embodiment. FIG. 1 is a sectional view taken from a side of the single wafer vapor-phase epitaxial growth apparatus. FIG. 2A shows a sectional view taken in the direction of the arrow A of the process chamber 4 (vapor phase epitaxial growth furnace 4) in the vapor-phase epitaxial growth apparatus of FIG. 1.

As shown in the figures, the vapor-phase epitaxial growth apparatus comprises a cassette 10, a transfer robot chamber 11, a load lock chamber 12, a transfer robot chamber 13 and the process chamber 4. The individual chambers are divided to be sealable by a gate valve. The cassette 10 is adjacent to the transfer robot chamber 11, the transfer robot chamber 11 is adjacent to the load lock chamber 12, the load lock chamber 12 is adjacent to the transfer robot chamber 13, and the transfer robot chamber 13 is adjacent to the process chamber 4.

The process chamber 4 is a vapor phase epitaxial growth furnace, which is kept to have a prescribed transferring temperature (e.g., 650° C.) and a hydrogen atmosphere in a stage before starting the vapor phase epitaxial growth process as described later. The process chamber 4 is made of quartz (SiO2).

The unprocessed silicon wafer substrates 1 or the unprocessed and processed silicon wafer substrates 1 are accommodated in the cassette 10. The cassette 10 is communicated with the atmosphere and kept at normal temperature.

The transfer robot chamber 11 is provided with a transfer robot 14. The transfer robot chamber 11 is communicated with the atmosphere and kept at normal temperature.

The load lock chamber 12 is a buffer chamber which is disposed to keep hydrogen gas in the process chamber 4 not in contact with oxygen (air) in the transfer robot chamber 11. The load lock chamber 12 is vacuumed and kept to have a nitrogen atmosphere under normal pressure.

The transfer robot chamber 13 is provided with the transfer robot 15. The transfer robot chamber 13 is kept to have a nitrogen atmosphere at normal temperature. The transfer robot 15 transfers the silicon wafer substrate 1, which is in a state placed on the blade 15*a* (transfer table), to the process chamber 4. The blade 15*a* is made of quartz (SiO2).

The susceptor 6 is provided in the process chamber 4. The susceptor 6 is supported by a susceptor support 7, and the susceptor support 7 is provided with a susceptor shaft 8. The susceptor shaft 8 is driven by a drive source 16. The susceptor shaft 8 rotates and also moves vertically. In a vapor phase epitaxial growth processing, the susceptor shaft 8 rotates, and the susceptor 6 is rotated at a prescribed rotation speed ω accordingly. In the placing process to be described later, the susceptor shaft 8 is moved up. When the susceptor shaft 8 is moved up, the susceptor 6 is moved up accordingly to place the silicon wafer substrate 1 onto the susceptor 6. The susceptor 6 is made of carbon (C) which is coated with silicon carbide (SiC).

The susceptor 6 is a processing table for heat treatment of the silicon wafer substrate 1, and the silicon wafer substrates 1 are transferred one at a time from the transfer robot chamber 13 of the previous stage via a gate valve 22 every time the epitaxial growth is completed and placed on the susceptor 6.

Specifically, the silicon wafer substrate 1 is removed from the cassette 10 by the transfer robot 14 and placed on the stage in the load lock chamber 12. The transfer robot 15 places the silicon wafer substrate 1 from the stage in the load lock chamber 12 onto the blade 15*a* and transfers to the process chamber 4. The silicon wafer substrate 1 is transferred to the above of the susceptor 6.

The process chamber 4 has therein the placing means 17 for placing the silicon wafer substrate 1, which is on the blade 15*a* of the transfer robot 15, onto the susceptor 6.

The placing means 17 comprises the lift pins 18, a wafer lift shaft 19 for supporting the lower ends of the lift pins 18, a lift shaft 20 which configures the lower portion of the wafer lift shaft 19, and the drive source 21 which vertically moves the lift shaft 20. The lift shaft 20 is a hollow shaft through which the susceptor shaft 8 can be inserted and disposed at the same concentric position as the susceptor shaft 8. The susceptor 6 has holes through which the lift pins 18 are vertically moved.

The lift pins 18 are members for supporting the silicon wafer substrate 1 in contact with the back surface of the silicon wafer substrate 1 and disposed in three in order to support three portions of the back surface of the silicon wafer substrate 1. When the drive source 21 is driven, the lift shaft 20 is moved vertically, and the lift pins 18 are moved vertically accordingly.

FIG. 2B is a top view showing a positional relation between blade 15*a* and the lift pins 18.

As shown in FIG. 2B, the lift pins 18 are disposed at positions such that they do not interfere with the blade 15*a* of the transfer robot 15 even when the blade 15*a* is moved in a carry-in direction A and a carry-out direction (retracting direction) B.

FIGS. 3A, 3B, 3C, 3D are views illustrating a processing (placing step) of placing the silicon wafer substrate 1 which is on the blade 15*a* onto the susceptor 6.

Specifically, the silicon wafer substrate 1 placed on the blade 15*a* is transferred to the above of the susceptor 6 (FIG. 3A). The silicon wafer substrate 1 which is placed on the blade 15*a* is left standing for a prescribed leaving time (FIG. 3B). Then, the lift pins 18 are moved up, and the silicon wafer substrate 1 which is on the blade 15*a* is lifted by the lift pins 18. The blade 15*a* is externally retracted from the process chamber 4 (FIG. 3C). The susceptor 6 is moved up, and the silicon wafer substrate 1 is placed on the susceptor 6. Thus, the silicon wafer substrate 1 is placed from the blade 15*a* onto the susceptor 6.

The wafer front surface-side heating lamps 5U are provided outside of the process chamber 4 and at an upper part in FIG. 1 and FIG. 2A, namely at the front surface side of the silicon wafer substrate 1, and the wafer back surface-side heating lamps 5L are provided outside of the process chamber 4 and at a lower part in the same figures, namely at the back surface side of the silicon wafer substrate 1. When the heating lamps 5U, 5L emit light, radiation heat is applied to the silicon wafer substrate 1 via the chamber 4. Thus, the silicon wafer substrate 1 reaches a growth temperature suitable for vapor phase growth.

As shown in FIG. 2A, a growth gas 41 consisting of a carrier gas (main gas) 41*a*, a material gas 41*b* and a doping gas 41*c* is supplied into the chamber 4 through a gas introduction port 60 of the process chamber 4 and flown along the top surface of the susceptor 6. The growth gas 41 having passed along the susceptor 6 is exhausted through a gas exhaust port 70 of the process chamber 4.

A heat ring 50 is disposed around the susceptor 6. The heat ring 50 divides the process chamber 4 into an upper section and a lower section with a gap sufficient to avoid contact with the outer circumference of the susceptor 6. Therefore, the growth gas 41 flowing along the upper side of the susceptor 6 can be prevented from unnecessarily flowing to the under side of the susceptor 6. And, the heat ring 50 which is around the susceptor 6 is heated by the heating lamps 5U, 5L, so that the temperature of the outer circumference of the susceptor 6 can be prevented from becoming ununiform.

To form a film 2 of the epitaxial growth layer, the silicon wafer substrate 1 having a conductivity type such as an N type or a P type is prepared. Impurities are added to the silicon wafer substrate 1. For example, if the conductivity type is a P type, boron (B) is added, and if the conductivity type is an N type, impurities such as phosphorus (Ph), arsenic (As) or antimony (Sb) are added.

The silicon wafer substrate 1 is placed on the susceptor 6 within the process chamber, a hydrogen ($H_2$) atmosphere is provided as the carrier gas 41*a* with the furnace interior kept at a high temperature.

The silicon wafer substrate 1 is left together with the carrier gas 41a, the material gas, the dopant gas 41c in the furnace 4 which is kept at a high temperature until a desired film thickness is obtained, so that the epitaxial growth layer thin film 2 is formed on the silicon wafer substrate 1. The resistivity of the epitaxial growth layer 2 is adjusted by controlling the concentration of the dopant gas 41c.

As the material gas 41b for forming an epitaxial growing film, for example, SiH4 (monosilane), SiH2Cl2 (dichrorosilane), SiHCl3 (trichlorosilane) and SiCl4 (silicon tetrachloride) are used. If the conductivity type of the epitaxial growth layer 2 is a P type, a boron (B) compound such as B2H6 (diborane) or BCl3 (trichloroboran) is used as the doping gas 41c, and if the conductivity type of the epitaxial growth layer 2 is an N type, PH3 (phosphine), AsH3 (arsine) or the like is used as the doping gas 41c.

The material gas 41b initiates a chemical reaction on the silicon wafer substrate 1 to form the same silicon epitaxial layer film 2 on the front surface of the silicon wafer substrate 1 as shown in FIG. 2C. Thus, a silicon epitaxial wafer 1' is manufactured. The following examples are described assuming that the P-type silicon epitaxial wafer 1' is manufactured by adding boron (B) as impurities.

Findings of the present invention will be described below.

FIG. 6 is a diagram illustrating a flow of heat when the blade 15a on which the silicon wafer substrate 1 is placed is positioned above the susceptor 6 (FIGS. 3A, 3B).

FIG. 7 is a diagram showing a relation between an elapsed time (the horizontal axis) after transferring the silicon wafer substrate 1 into the process chamber 4 and the front surface temperature and the back surface temperature (the vertical axis) of the silicon wafer substrate 1.

As shown in FIG. 6, infrared rays are irradiated from the front surface-side heating lamps 5U toward the wafer front surface as indicated by arrows C, and infrared rays are irradiated from the back surface-side heating lamps 5L toward the wafer back surface as indicated by arrows D.

Here, in a temperature region (hereinafter referred to as the infrared transmitting temperature region) of 400° C. to 600° C., the short-wavelength (1 μm) infrared rays being irradiated from above are easy to pass through the silicon wafer substrate 1 and the blade 15a which are made of silicon or quartz as indicated by arrows E. Therefore, the infrared rays irradiated from the above pass through the silicon wafer substrate 1 and the blade 15a and are absorbed as heat by the susceptor 6. The susceptor 6 absorbs as heat the infrared rays irradiated from the below in addition to the infrared rays having passed through from the above.

Meanwhile, light radiated from the susceptor 6 is about 3 μm, which is in a wavelength region easily absorbed by silicon (Si) in the infrared transmitting temperature region (400° C. to 600° C.). Therefore, the light radiated from the susceptor 6 is absorbed as heat by the back surface of the silicon wafer substrate 1 as indicated by arrows F. In the infrared transmitting temperature region (400° C. to 600° C.), the back surface of the silicon wafer substrate 1 tends to have an increase in temperature in comparison with the front surface.

The above situation is described with reference to FIG. 7. The horizontal axis of FIG. 7 denotes an elapsed time after transferring the silicon wafer substrate 1 into the process chamber 4 but can be determined as a temperature of the silicon wafer substrate 1. And, the vertical axis of FIG. 7 denotes the front surface temperature and the back surface temperature of the silicon wafer substrate 1 but can be determined as a transmittance of the infrared rays to the silicon (wafer).

When the silicon wafer substrate 1 is transferred to the process chamber 4, the front surface temperature and the back surface temperature of the silicon wafer substrate 1 which have been normal temperature are increased in a substantially same curve. But, when they belong to an infrared temperature region at certain time t1, infrared transmittance becomes large, so that a difference between the wafer front surface temperature and the wafer back surface temperature increases gradually. This temperature difference has a maximum value at time t2 when the infrared temperature region has an upper limit value of 600° C. When the temperature difference becomes the maximum value, the silicon wafer substrate 1 performs heat diffusion. If the wafer back surface is contacted with the lift pins 18 before the temperature difference reaches the maximum value, the silicon wafer substrate 1 is warped suddenly and dust is produced.

Specifically, if the temperature difference between the wafer front surface temperature and the wafer back surface temperature becomes the maximum value or if the silicon wafer substrate 1 is warped is at a time when the wafer back surface is contacted with the lift pins 18 or the susceptor 6 or after the contact, the contact of the lift pins 18 or the susceptor 6 which is roughly finished with the wafer back surface causes to warp the silicon wafer substrate 1, and the warping (abrupt movement) causes to produce dust because the wafer back surface is rubbed by the lift pins 18 or the susceptor 6.

Accordingly, the present inventors considered that the dust generation due to the warping of the wafer can be prevented if the temperature difference between the wafer front surface temperature and the wafer back surface temperature becomes the maximum value or the warping occurs before the contact of the wafer back surface with the lift pins 18 or the susceptor 6.

In other words, when the placing process is performed by the placing means 17 at a time later than the time t2 when the infrared temperature region has the upper limit value of 600° C. in FIG. 7 to contact the lift pins 18 with the wafer back surface, the dust generation due to the warping of the wafer can be prevented.

Factors for improvement of the dust generation due to warping of the silicon wafer substrate 1 are combined to the following three, and the improving method is as follows.

Leaving Time

The leaving time means a time period between the transfer of the silicon wafer substrate 1 to the process chamber 4 and the placing of the silicon wafer substrate 1 onto the susceptor 6. By setting the leaving time to a long time, the placing process can be performed after waiting until the time t2 when the temperature difference between the wafer front surface temperature and the back surface temperature becomes the maximum value in FIG. 7.

Transferring Temperature

The transferring temperature means a temperature within the process chamber 4 at the time when the silicon wafer substrate 1 is transferred into the process chamber 4. Setting the transferring temperature to a high temperature allows advancing the time t2 when the temperature difference between the wafer front surface temperature and the back surface temperature of FIG. 7 reaches the maximum value, so that the transferring process can be performed after the time when the maximum value is obtained.

Output Ratio

The output ratio means an output ratio which is expressed by an electric power ratio (a power ratio) between the wafer front surface-side heating lamps 5U and the wafer back surface-side heating lamps 5L. By setting the output ratio to a level that the output of the wafer back surface-side heating lamps 5L is considerably larger than the output of the wafer front surface-side heating lamps 5U, heating of the wafer back surface can be rate-determined, the time t2 when the temperature difference between the wafer front surface temperature and the back surface temperature becomes the maximum value can be advanced in FIG. 7, and the placing process can be performed at the time or after when the maximum value is obtained. In the following description, the output ratio is indicated by an output percentage of the back surface-side heating lamps 5L assuming that a total output of the wafer front surface-side heating lamps 5U and the wafer back surface-side heating lamps 5L is 100%.

The above-three factors can be adjusted by controlling the placing means 17, the transfer robot 15 and the heating lamps 5U, 5L by the controller 30.

In the experiments of the following examples, an epitaxial growth layer 2 having a thickness of 4 □m was formed on a P-type silicon wafer substrate 1 to which boron was added under a growth temperature of 1130° C. As the silicon wafer substrate 1, a high impurity concentration P++ wafer having a resistivity in a range of 5/1000 to 10/1000 (□·cm) and a low impurity concentration P− wafer having a resistivity in a range of 10 to 20 (□·cm) were prepared to perform experiments.

It was found through the experiments that the low impurity concentration P− wafer had a tendency to warp in comparison with the high impurity concentration P++ wafer.

FIRST EXAMPLE

Control of Leaving Time

The leaving time can be adjusted by controlling the drive of the placing means 17 and the transfer robot 15 by the controller 30.

FIGS. 4A, 4B, 4C, 4D each are schematic diagrams showing side views of the states of the silicon wafer substrate 1 in correspondence with FIGS. 3A, 3B, 3C, 3D when the method of Example 1 is performed. FIGS. 5A, 5B, 5C, 5D each are schematic diagrams showing side views of the states of the silicon wafer substrate 1 in correspondence with FIGS. 3A, 3B, 3C, 3D when the method of a comparative example is performed.

In the comparative example, the leaving time was adjusted to 10 seconds, the transferring temperature was adjusted to 650° C., and the output ratio (output percentage of the back surface-side heating lamps 5L) was adjusted to 85%.

Meanwhile, in this example, the transferring temperature and the output ratio were determined to be the same as in the comparative example but the leaving time was adjusted to 20 seconds which was longer than in the comparative example.

In the comparative example, as shown in FIGS. 5A, 5B, 5C, 5D, the silicon wafer substrate 1 was transferred to the above of the susceptor 6 of the process chamber 4 (FIG. 5A), and it was left standing as it was for 10 seconds (FIG. 5B). In the above process, the posture of the silicon wafer substrate 1 did not change, but when the lift pins 18 were contacted to the back surface of the silicon wafer substrate 1, the silicon wafer substrate 1 was suddenly warped to have a concave shape on the lift pins 18 and to generate dust (FIG. 5C). Then, the silicon wafer substrate 1 which was displaced into the concave shape as a result of a convergence of vibrations due to warping was placed on the susceptor 6 (FIG. 5D). LPDs (light point defects) on the front surface of the silicon epitaxial wafer 1' were counted by a particle counter (e.g., SP-1) as shown in FIG. 8B, and lots of defects with large size particles were measured on the wafer front surface. When they were observed through a microscope, defects with large size particles of about 10 μm were observed as shown in FIG. 8C.

Meanwhile, in this embodiment, as shown in FIGS. 4A, 4B, 4C, 4D, the silicon wafer substrate 1 was transferred to the above of the susceptor 6 of the process chamber 4 (FIG. 4A) and left standing as it was for 20 seconds. During that period (about 15 seconds later), the wafer was warped on the blade 15a (FIG. 4B). After the lapse of the leaving time of 20 seconds, the lift pins 18 were contacted to the back surface of the silicon wafer substrate 1, but dust was not generated because the wafer had the vibrations due to the warping converged (FIG. 4C). Then, the silicon wafer substrate 1 which was displaced into the concave shape as a result of a convergence of vibrations due to warping was placed on the susceptor 6 (FIG. 4D). Therefore, the LPDs on the front surface of the silicon epitaxial wafer 1' were counted by the particle counter to find that the defects with large size particles measured on the wafer front surface were quite few as shown in FIG. 8A.

Experiments were performed on the silicon epitaxial wafer 1' formed on the low impurity concentration P− silicon wafer substrate 1 with the leaving time varied to obtain the measured results as shown in FIG. 9 to FIG. 11.

FIG. 9 shows the measured results obtained by adjusting the transferring temperature to 650° C. and the output ratio (output percentage of the back surface-side heating lamps 5L) to 85%, setting the leaving time to 10 seconds (comparative example) and 30 seconds, and counting the LPDs having a diameter of 0.25 μm or more.

The horizontal axis of FIG. 9 indicates a lot that the leaving time was set to 10 seconds and a lot that the leaving time was set to 30 seconds. The vertical axis of FIG. 9 indicates the LPD counts of individual samples in the lots. FIG. 9 shows a range of variations of the counts of the individual samples in the lots, an average value of the counts and a range of average value±3σ of the counts (a range of appearance probability of 99.7%: σ is standard deviation).

It is apparent from FIG. 9 that the example having the leaving time of 30 seconds had considerably low LPD counts in comparison with the comparative example having the leaving time of 10 seconds and had the number of defects with large size particles measured on the wafer front surface decreased considerably.

FIG. 10 shows the measured results obtained by adjusting the transferring temperature to 650° C. and the output ratio (output percentage of the back surface-side heating lamps 5L) to 85% and counting the LPDs having a diameter of 0.25 μm or more with the leaving time set to 20 seconds and 30 seconds.

The horizontal axis of FIG. 10 indicates a lot that the leaving time was set to 20 seconds and a lot that the leaving time was set to 30 seconds. The vertical axis of FIG. 10 indicates the LPD counts of individual samples in the lots. FIG. 10 shows a range of variations of the counts of the individual samples in the lots, an average value of the counts and a range of average value±3σ of the counts.

It is apparent from FIG. 10 that the example having the leaving time of 30 seconds had considerably low LPD counts in comparison with the example having the leaving time of 20 seconds and had the number of defects with large size particles measured on the wafer front surface decreased considerably.

FIG. 11 shows the measured results obtained by adjusting the transferring temperature to 650° C. and the output ratio (output percentage of the back surface-side heating lamps 5L) to 85%, and counting the LPDs having a diameter of 0.25 μm or more with the leaving time set to 5 seconds (comparative example), 10 seconds (comparative example) and 30 seconds (example).

The horizontal axis of FIG. 11 indicates a lot that the leaving time was set to 5 seconds, a lot that the leaving time was set to 10 seconds, and a lot that the leaving time was set to 30 seconds. The vertical axis of FIG. 11 indicates the LPD counts of individual samples in the lots. FIG. 11 shows a range of variations of the counts of the individual samples in the lots, an average value of the counts, and a range of average value±3□ of the counts.

It is apparent from FIG. 11 that the example having the leaving time of 30 seconds had considerably low LPD counts in comparison with the comparative examples having the leaving time of 5 seconds and 10 seconds and had the number of defects with large size particles measured on the wafer front surface decreased considerably.

As described above, the obtained results indicate that when the leaving time is increased, the number of defects with large size particles on the front surface of the silicon epitaxial wafer 1' is decreased gradually.

As described above, according to this example, dust generation due to the warping of the wafer can be prevented because the leaving time was adjusted to 20 seconds or more (desirably, to 30 seconds or more) to generate warping in the silicon wafer substrate 1 (namely, the temperature difference between the wafer front surface temperature and the back surface temperature was increased to the maximum value) before the placing process (placing step) was performed. Thus, the defects with large size particles on the front surface of the silicon epitaxial wafer 1' were decreased considerably, and the quality of the silicon epitaxial wafer 1' and also the quality of the semiconductor device manufactured from it could be improved considerably.

SECOND EXAMPLE

Control of Transferring Temperature

The transferring temperature can be adjusted by controlling the output of the wafer front surface-side heating lamps 5U and the wafer back surface-side heating lamps 5L by the controller 30.

Experiments were performed on the silicon epitaxial wafer 1' formed on the low impurity concentration P– silicon wafer substrate 1 with the transferring temperature varied. The measured results obtained are shown in FIG. 12.

FIG. 12 shows the measured results obtained by adjusting the leaving time to 20 seconds and the output ratio (output percentage of the back surface-side heating lamps 5L) to 85% and counting the LPDs having a diameter of 0.25 μm or more with the transferring temperature set to 650° C., 700° C. and 750° C.

The horizontal axis of FIG. 12 indicates a lot that the transferring temperature was set to 650° C., a lot that the transferring temperature was set to 700° C., and a lot that the transferring temperature was set to 750° C. The vertical axis of FIG. 12 indicates the LPD counts of the individual samples in the lots. FIG. 12 shows a range of variations of the counts of the individual samples in the lots, an average value of the counts, and a range of average value±3σ of the counts.

It is apparent from FIG. 12 that the example having the transferring temperature of 750° C. has the LPD counts decreased considerably in comparison with the examples having the transferring temperatures of 650° C. and 700° C., and the defects with large size particles measured on the wafer front surface are decreased considerably. But, when the transferring temperature was in a range of 650 to 700° C., there was no tendency that the defects with large size particles on the front surface of the silicon epitaxial wafer 1' were decreased gradually as the transferring temperature was increased.

As described above, according to this example, dust generation due to the warping of the wafer can be prevented because the transferring temperature was adjusted (desirably to 750° C. or more) to generate warping in the silicon wafer substrate 1 (namely, the temperature difference between the wafer front surface temperature and the back surface temperature was increased to the maximum value), and the placing process (placing step) was performed. Thus, the defects with large size particles on the front surface of the silicon epitaxial wafer 1' were decreased considerably, and the quality of the silicon epitaxial wafer 1' and also the quality of the semiconductor device manufactured from it could be improved considerably.

THIRD EXAMPLE

Control of Output Ratio

The output ratio can be adjusted by controlling the output of the wafer front surface-side heating lamps 5U and the wafer back surface-side heating lamps 5L by the controller 30.

Experiments were performed on the silicon epitaxial wafer 1' formed on the low impurity concentration P– silicon wafer substrate 1 with the output ratio varied. The measured results obtained are shown in FIG. 13.

FIG. 13 shows the measured results obtained by adjusting the leaving time to 20 seconds and the transferring temperature to 650° C. and counting the LPDs having a diameter of 0.25 μm or more with the output ratio (output percentage of the back surface-side heating lamps 5L) set to 75%, 85% and 95%.

The horizontal axis of FIG. 13 indicates a lot that the output ratio was 75%, a lot that the output ratio was 85%, and a lot that the output ratio was 95%. The vertical axis of FIG. 13 indicates the LPD counts of the individual samples in the lots. FIG. 13 shows a range of variations of the counts, an average value of the counts, and a range of average value±3σ of the counts of the individual samples in the lots.

It is apparent from FIG. 13 that the example having the output ratio of 95% has the LPD counts decreased considerably and the defects with large size particles measured on the wafer front surface decreased considerably in comparison with the examples having the output ratio of 75% and 85%. But, when the output ratio was in the range of 75% to 85%, there was no tendency that the defects with large size particles on the front surface of the silicon epitaxial wafer 1' were decreased gradually as the output ratio was increased.

As described above, according to this example, dust generation due to the warping of the wafer can be prevented because the output ratio was adjusted (desirably to 95% or more) to generate warping in the silicon wafer substrate 1 (namely, the temperature difference between the wafer front surface temperature and the back surface temperature was increased to the maximum value) before the placing process (placing step) was performed. Thus, the defects with large size particles on the front surface of the silicon epitaxial wafer 1' were decreased considerably, and the quality of the silicon epitaxial wafer 1' and also the quality of the semiconductor device manufactured from it could be improved considerably.

FOURTH EXAMPLE

Control of Leaving Time and Output Ratio

The defects with large size particles can be decreased by adjusting the leaving time and the output ratio.

FIG. 14 shows the experimental results obtained on the silicon epitaxial wafer 1' formed on the low impurity concentration P– silicon wafer substrate 1 with the leaving time and the output ratio varied.

FIG. 14 shows the measured results obtained by adjusting the transferring temperature to 650° C. and counting the LPDs having a diameter of 0.25 μm or more with the output ratio (output percentage of the back surface-side heating lamps 5L) and the leaving time set to 85% and 20 seconds, 85% and 30 seconds, 95% and 10 seconds, 95% and 20 seconds and 95% and 30 seconds.

The horizontal axis of FIG. 14 indicates a lot #101 having the output ratio and the leaving time set to 85% and 20 seconds, a lot #102 having the output ratio and the leaving time set to 85% and 30 seconds, a lot #103 having the output ratio and the leaving time set to 95% and 10 seconds, a lot #104 having the output ratio and the leaving time set to 95% and 20 seconds, and a lot #105 having the output ratio and the leaving time set to 95% and 30 seconds. The vertical axis of FIG. 14 indicates the LPD counts of the individual samples in the lots. FIG. 14 shows a range of variations of the counts, an average value of the counts, and a range of average value±3σ of the counts of the individual samples in the lots.

It is apparent from FIG. 14 that the examples #102, #104 and #105 have the LPD counts decreased considerably and the defects with large size particles measured on the wafer front surface decreased considerably in comparison with the examples #101 and #103. Specifically, there was obtained the result that the defects were decreased substantially by adjusting the output ratio to 95% when the leaving time was 20 seconds and the output ratio to 85% or 95% when the leaving time was 30 seconds.

As described above, according to the example, dust generation due to the warping of the wafer can be prevented because the output ratio and the leaving time were adjusted (desirably adjusted to the output ratio of 95% or more when the leaving time was 20 seconds, and the output ratio of 85%, 95% or 95% or more when the leaving time was 30 seconds) to generate warping in the silicon wafer substrate 1 (namely, the temperature difference between the wafer front surface temperature and the back surface temperature was increased to the maximum value) before the placing process (placing step) was performed. Thus, the defects with large size particles on the front surface of the silicon epitaxial wafer 1' were decreased considerably, and the quality of the silicon epitaxial wafer 1' and also the quality of the semiconductor device manufactured from it could be improved considerably.

In the above description, the heat treatment for forming the epitaxial growth layer was assumed, but the present invention can also be applied if there is a possibility of generation of warping in the wafer by transferring the silicon wafer substrate to the heat treatment chamber and performing the placing process (placing step) to place it onto the processing table. For example, the present invention can also be applied to the manufacturing of an annealed wafer.

The example was described assuming that the silicon wafer substrate 1 was placed from the blade 15a of the transfer robot 15 onto the susceptor 6 via the lift pins 18, but the present invention can also be applied to a case that the silicon wafer substrate 1 is directly placed on the susceptor 6 by dropping from the transfer robot. And, the transfer robot 15 is not limited to the structure of the example that the silicon wafer substrate 1 is placed on the blade 15a and transferred but may be applied to a structure that the silicon wafer substrate 1 is transferred by catching it by a chuck or the like or adsorbing it by a vacuum cup or the like.

The present invention can also be applied to the manufacturing of a semiconductor wafer of GaAs (gallium arsenic) or the like other than the silicon wafer.

BRIEF DESCRIPTION OF THE DRAWINGS

FIGS. 3A, 3B, 3C, 3D are views illustrating a placing process (placing step) by a placing means.

FIGS. 4A to 4D are views schematically showing a side of a silicon wafer substrate of an example in correspondence with FIGS. 3A to 3D.

FIGS. 5A to 5D are views schematically showing a side of a silicon wafer substrate of a comparative example in correspondence with FIGS. 3A to 3D.

FIGS. 8A, 8B are views showing defects on silicon epitaxial wafer front surfaces of an example and a comparative example, and FIG. 8C is a magnified view of the defects.

Figure 1:
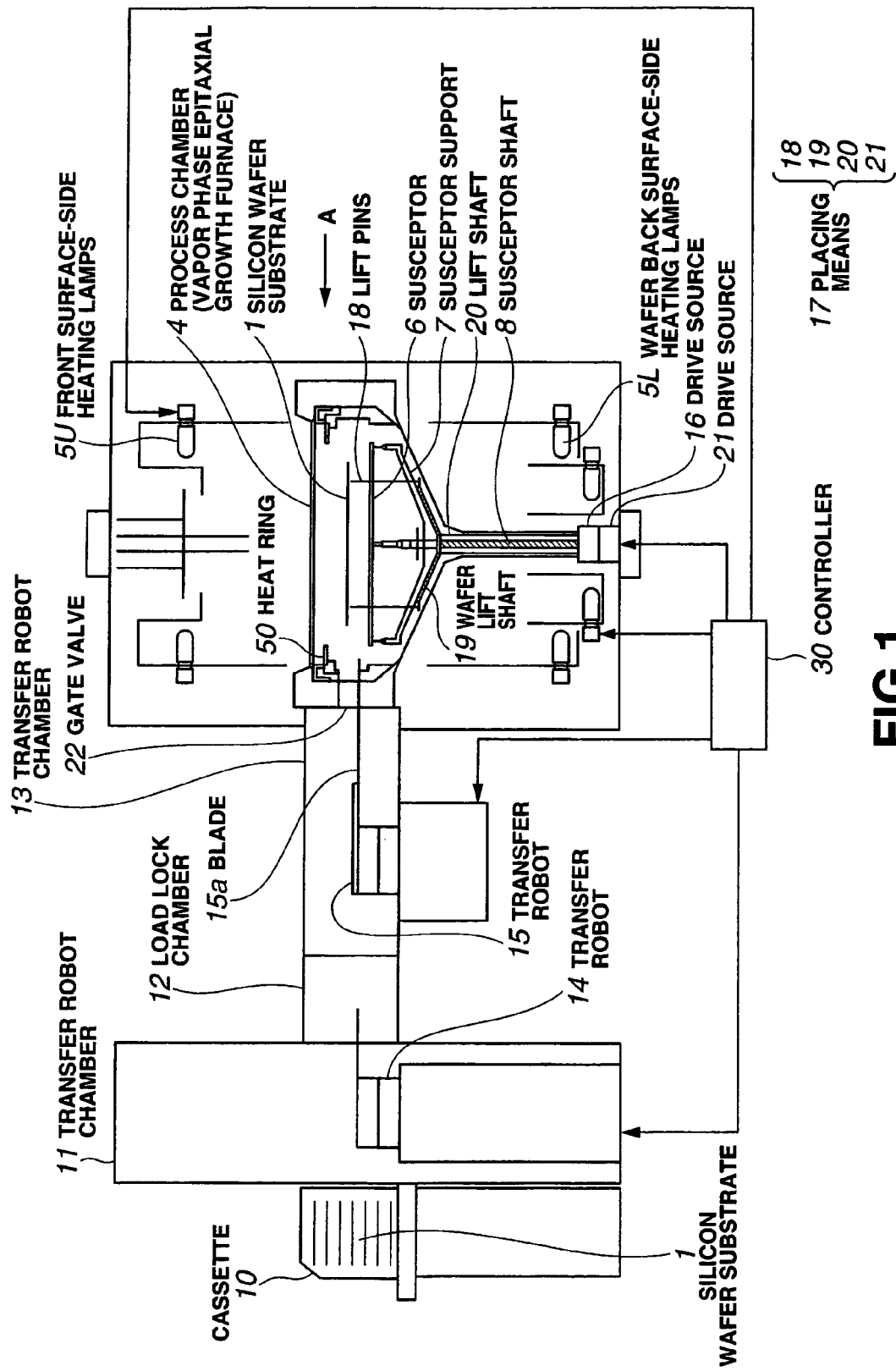
FIG. 1 is a diagram showing the whole structure of a silicon epitaxial wafer manufacturing apparatus according to an example.
Figure 2A:
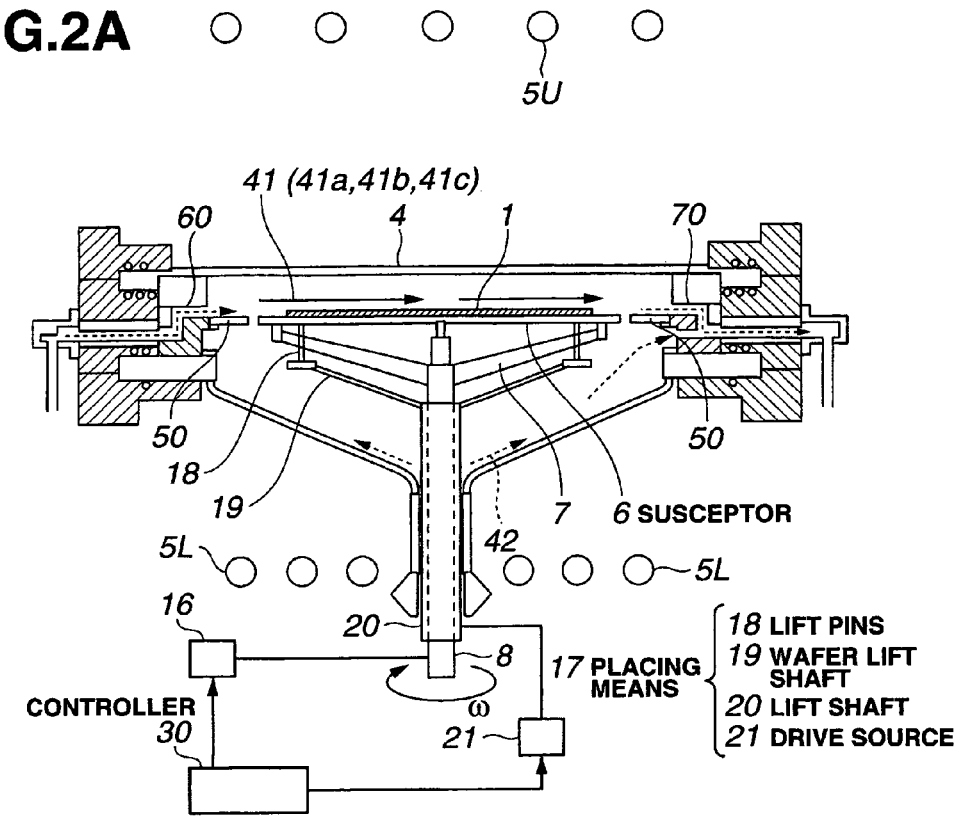
FIG. 2A is a view taken in the direction of arrow A of the process chamber of FIG. 1.
Figure 2B:
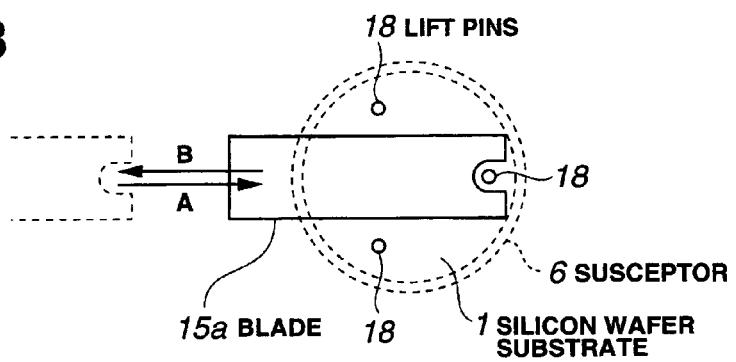
FIG. 2B is a diagram showing a positional relation between a blade and lift pins of the transfer robot of FIG. 1.
Figure 2C:
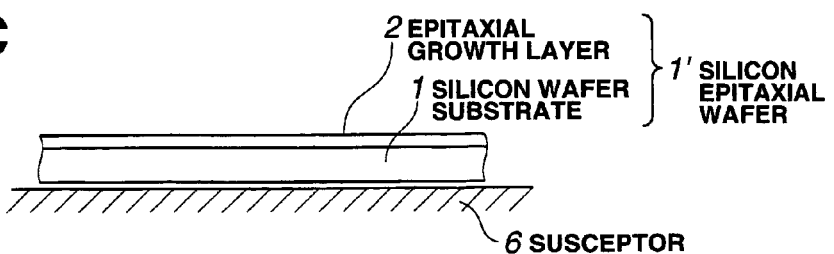
FIG. 2C is a view schematically showing a cross section of the silicon epitaxial wafer.
Figure 6:
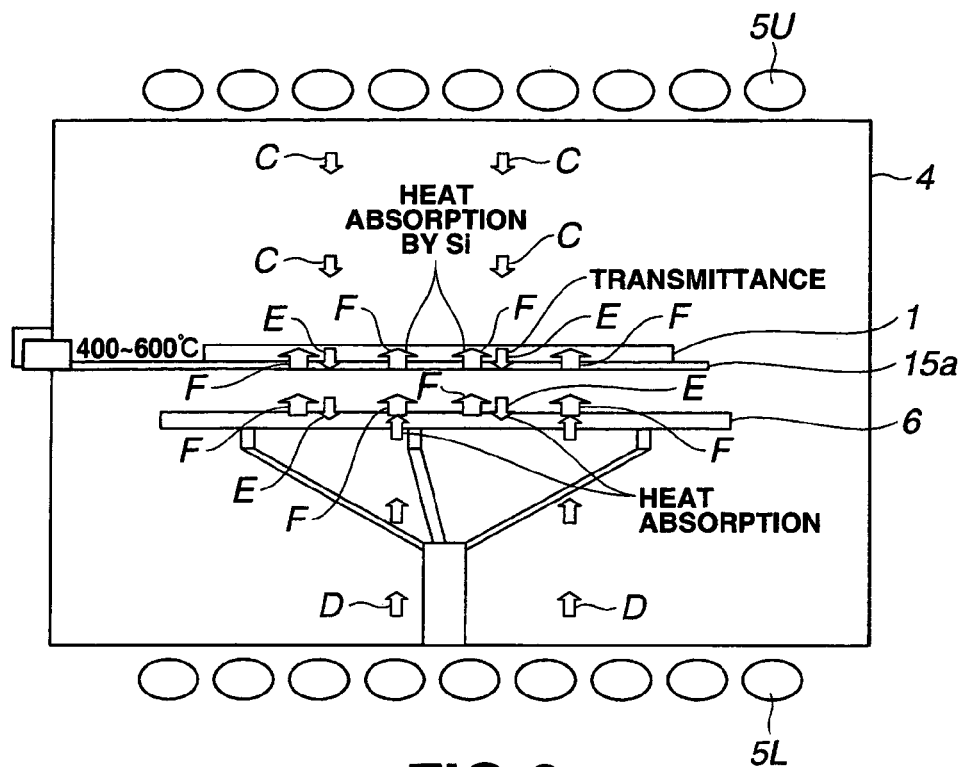
FIG. 6 is a view illustrating a flow of heat within a process chamber in a previous stage of the placing process (placing step).
Figure 7:
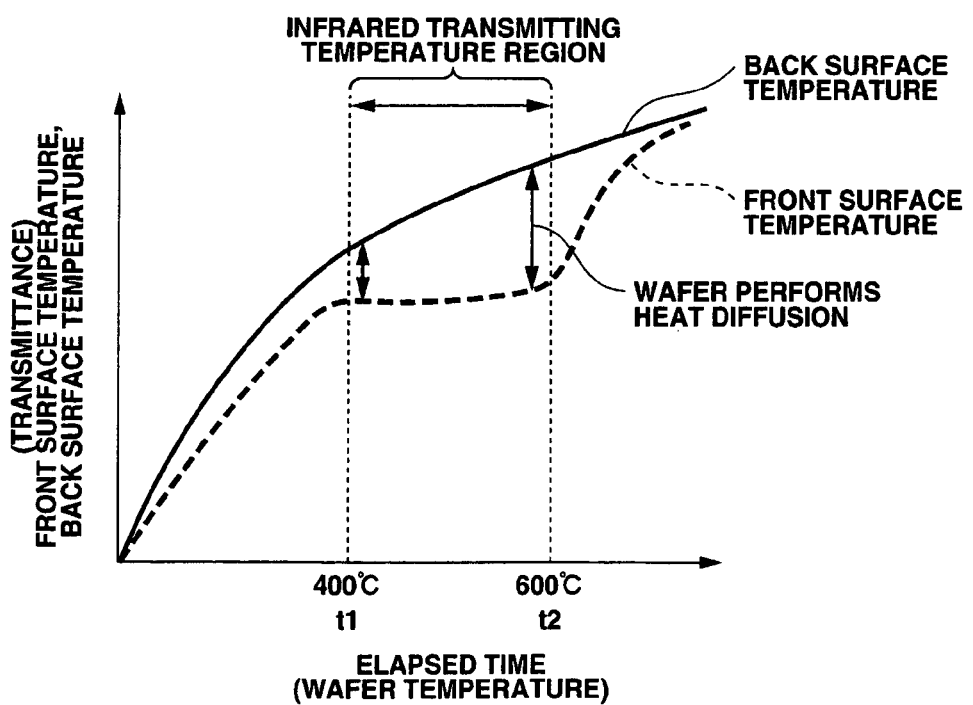
FIG. 7 is a graph showing a relationship among a time period from the transfer of a silicon wafer substrate to a process chamber, a wafer front surface temperature and its back surface temperature.
Figure 9:
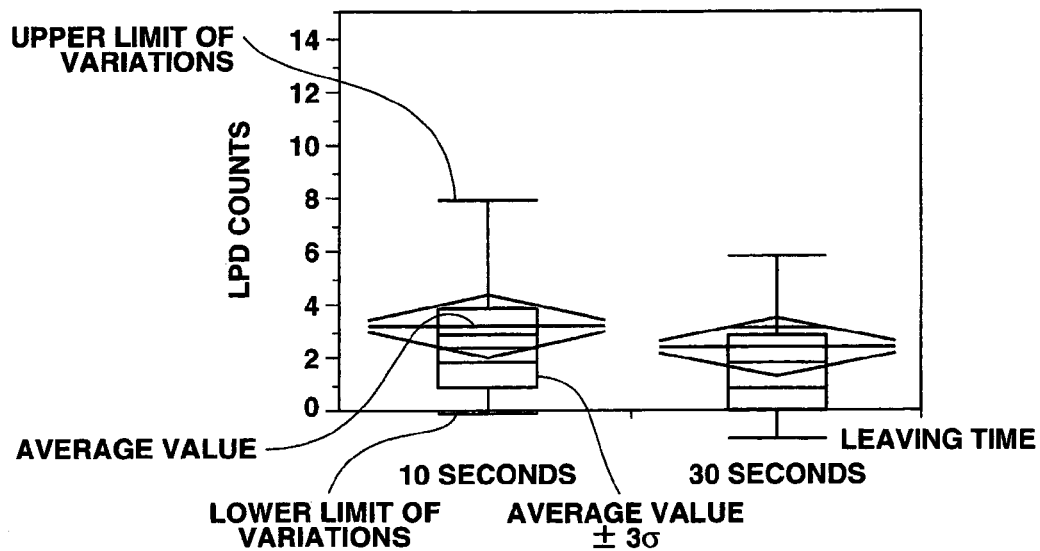
FIG. 9 is a graph showing the experimental results of a first example.
Figure 10:
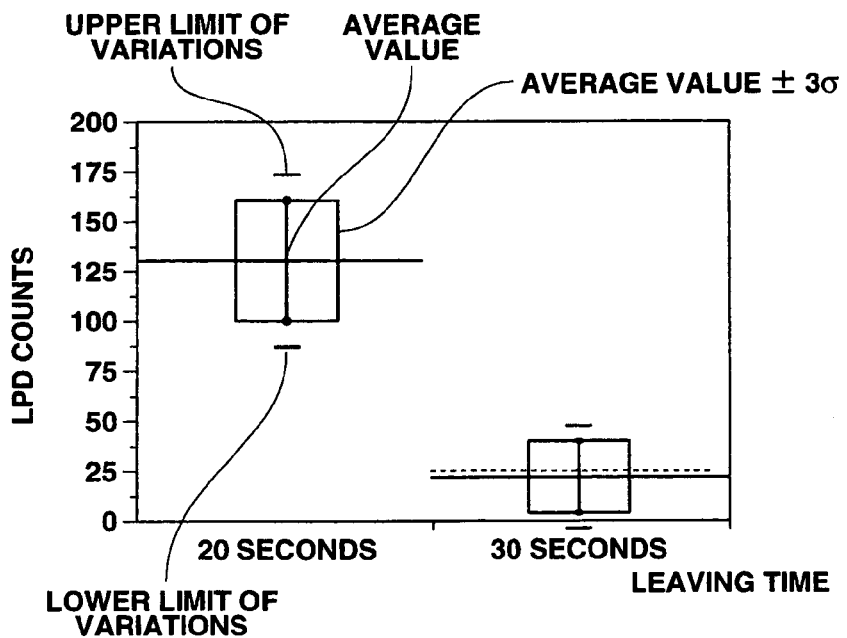
FIG. 10 is a graph showing the experimental results of the first example.
Figure 11:
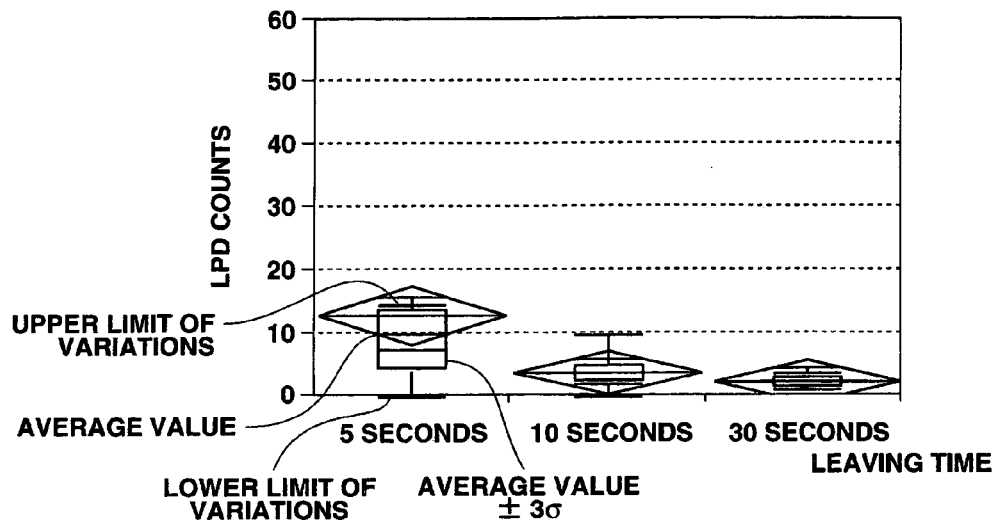
FIG. 11 is a graph showing the experimental results of the first example.
Figure 12:
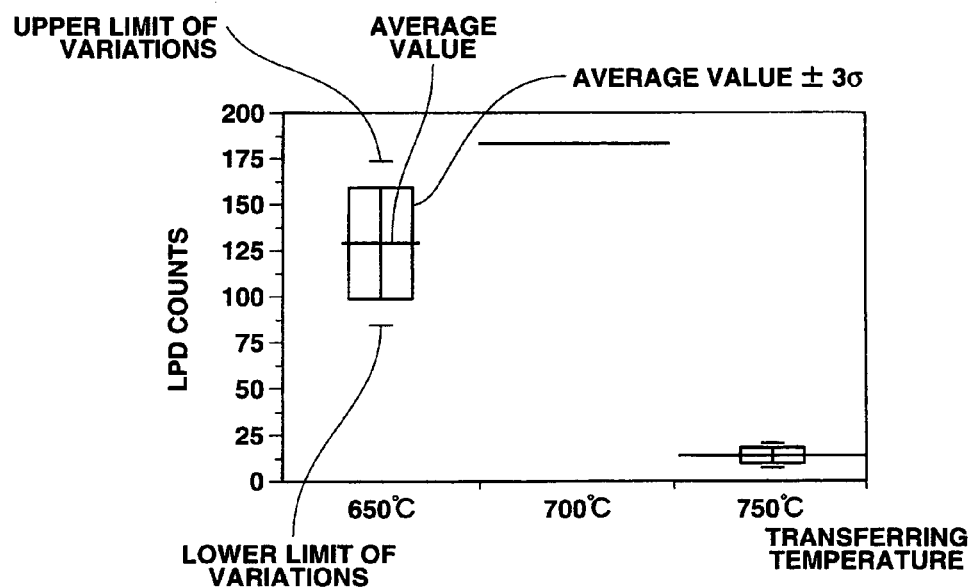
FIG. 12 is a graph showing the experimental results of a second example.
Figure 13:
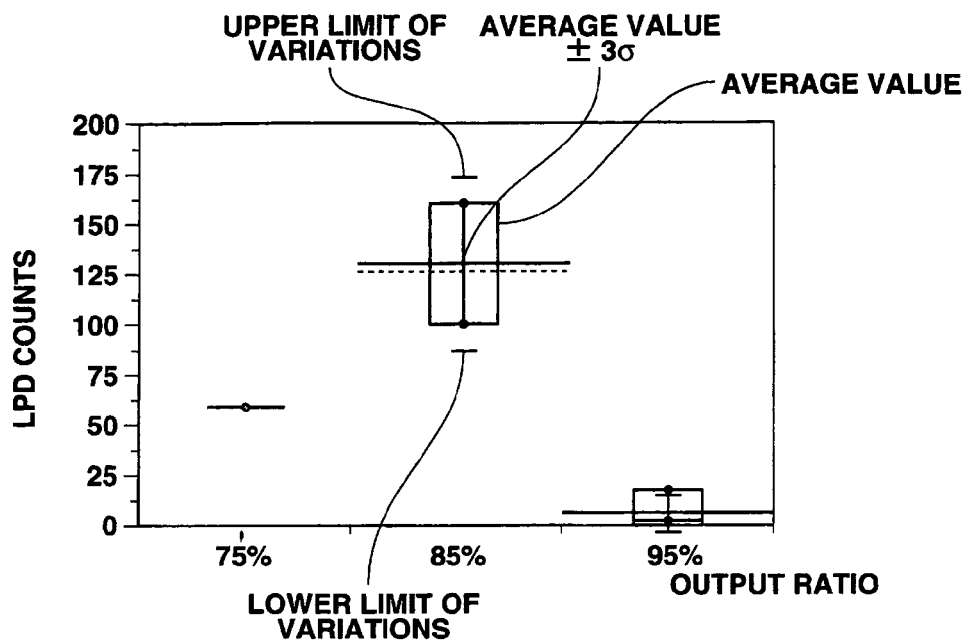
FIG. 13 is a graph showing the experimental results of a third example.
Figure 14:
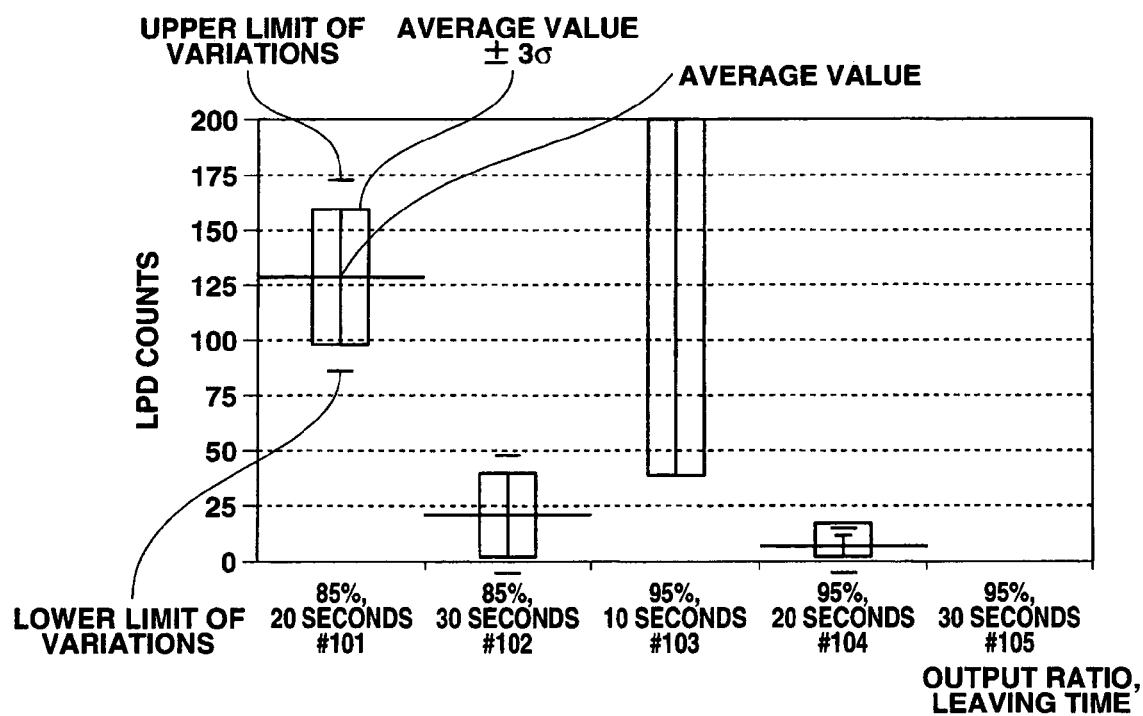
FIG. 14 is a graph showing the experimental results of a fourth example.

The invention claimed is:

1. An apparatus for manufacturing a semiconductor wafer, comprising:
    a heat treatment chamber which is provided with a processing table on which a wafer substrate is placed, a transfer means having a surface which transfers the wafer substrate to the heat treatment chamber,
    a placing means which places the wafer substrate transferred by transfer means onto the processing table,
    a front surface-side heating means which heats a front surface of the wafer substrate,
    a back surface-side heating means which heats a back surface of the wafer substrate,
    an automated control means which controls the transfer means to transfer the wafer substrate to a location suspended on the surface above the processing table in the heat treatment chamber and to suspend the wafer substrate on the surface above the processing table for a predetermined time period until the wafer substrate is warped, and a placing control means which controls the placing means to place the warped wafer substrate onto the processing table by the placing means, the wafer substrate being warped from being suspended above the processing table by the transfer means for the predetermined time period.

2. An apparatus for manufacturing a semiconductor wafer, comprising:

a heat treatment chamber which is provided with a processing table on which a wafer substrate is placed, a transfer means with a surface which transfers the wafer substrate to the heat treatment chamber, a placing means which places the wafer substrate transferred by the transfer means onto the processing table, a front surface-side heating means which heats a front surface of the wafer substrate, a back surface-side heating means which heats a back surface of the wafer substrate, an automated transfer control means which controls the transfer means to transfer the wafer substrate on the surface above the processing table in the heat treatment chamber and to suspend the wafer substrate above the processing table for a predetermined time period until the wafer substrate is warped, and a placing control means which controls the placing means to place the warped wafer substrate onto the processing table by the placing means, the wafer substrate being warped from being suspended on the surface above the processing table by the transfer means for the predetermined time period that causes a temperature difference between a front surface temperature and a back surface temperature of the wafer substrate to reach a maximum value.

3. An apparatus for manufacturing a semiconductor wafer, comprising:

a heat treatment chamber which is provided with a processing table on which a wafer substrate is placed, a transfer means having a surface which transfers the wafer substrate to the heat treatment chamber a placing means which places the wafer substrate transferred by the transfer means onto the processing table, a front surface-side heating means which heats a front surface of the wafer substrate, a back surface-side heating means which heats a back surface of the wafer substrate, an automated transfer control means which controls the transfer means to transfer the wafer substrate on the surface above the processing table in the heat treatment chamber and to suspend the wafer substrate on the surface above the processing table for a predetermined time period of 20 seconds or more until the wafer substrate is warped, and a placing control means which controls the placing means to place the wafer substrate onto the processing table by the placing means, the wafer substrate being warped as having been suspended above the processing table by the transfer means 4. A method for manufacturing a semiconductor wafer, comprising transferring a wafer substrate to a heat treatment chamber by a transfer means having a surface and placing by a placing means the wafer substrate transferred to the heat treatment chamber onto a processing table, for heat-treating the wafer substrate, comprising:

transferring, by the transfer means, the wafer substrate on the surface above the processing table in the heat treatment chamber;

suspending the wafer substrate, by the transfer means, on the surface above the processing table for a prescribed time period to cause a temperature difference between a front surface temperature and a back surface temperature of the wafer substrate to reach a maximum value; warping the substrate due to the maximum temperature difference; and placing, by the placing means, the wafer substrate onto the processing table after having been put into a warped state.

5. A method for manufacturing a semiconductor wafer, in which a wafer substrate is heat-treated in a heat treatment chamber, comprising:

a step of transferring the wafer substrate to above a processing table in the heat treatment chamber by a transfer means and suspending the wafer substrate, by the transfer means on a surface above the processing table for a prescribed time period;

a step of irradiating infrared rays in an infrared transmitting temperature region onto a front surface side and a back surface side of the wafer substrate which is suspended, by the transfer means on a surface above the processing table, respectively by a front surface heating means and a back surface heating means;

a step of causing radiant heat via the heat treatment chamber by irradiating the infrared rays, applying the radiant heat of the wafer substrate, radiating on the back surface of the wafer substrate via the processing table the infrared ray that has reached the processing table among the infrared rays that have been irradiated by the front surface means and that have transmitted through the wafer substrate and causing the infrared rays from the front surface heating and the back surface heating means to be heat-absorbed by the processing table;

a step of causing a temperature difference between a front surface temperature and a back surface temperature of the wafer substrate, which is suspended by the transfer means on a surface above the processing table to reach a maximum value to thereby put the wafer substrate suspended by the transfer means in a warped state; and a step of placing the wafer substrate after having been put into the warped state onto the processing table by the placing means.

6. A method for manufacturing a semiconductor wafer, which a wafer substrate is heat-treated in a heat treatment chamber, comprising:

a step of transferring the wafer substrate to a transfer table on a surface above a processing table in the heat treatment chamber by the transfer table, the transfer table surface being made of a material which allows infrared rays of short wavelength in the infrared transmitting temperature region and suspending the wafer substrate on the transfer table surface, by the transfer means above the processing table for a prescribed time period:

a step of irradiating the infrared rays in the infrared transmitting temperature region onto a front surface side and a back surface side of the wafer substrate which is suspended on the transfer table above the processing table, respectively by a front surface heating means and a back surface heating means;

a step of causing radiant heat via the heat treatment chamber by irradiating the infrared rays, applying the radiant heat to the wafer substrate, radiating on the back surface of the wafer substrate via the processing table the infrared ray that has reached the processing table among the infrared rays that have been irradiated by the front surface means and that have transmitted through the wafer substrate and causing the infrared rays from the front surface heating and the back surface heating means to be heat-absorbed by the processing table:

a step of causing a temperature difference between a front surface temperature and a back surface temperature of the wafer substrate suspended by the transfer means above the processing table to reach a maximum value to thereby put the wafer substrate suspended on the transfer table surface in a warped state; and a step of placing the wafer substrate after having been put into the warped state onto the processing table by the placing means.

* * * * *